(12) United States Patent  (10) Patent No.: US 8,922,213 B2
Nozaki  (45) Date of Patent: *Dec. 30, 2014

(54) MAGNETIC RESONANCE IMAGING APPARATUS

(71) Applicants: Kabushiki Kaisha Toshiba, Minato-Ku, Tokyo (JP); Toshiba Medical Systems Corporation, Otawara-Shi, Tochigi-Ken (JP)

(72) Inventor: Seiji Nozaki, Otawara (JP)

(73) Assignees: Kabushiki Kaisha Toshiba, Minato-ku, Tokyo (JP); Toshiba Medical Systems Corporation, Otawara-shi, Tochigi-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/869,056

(22) Filed: Apr. 24, 2013

(65) Prior Publication Data

US 2013/0234715 A1  Sep. 12, 2013

Related U.S. Application Data

(62) Division of application No. 12/854,414, filed on Aug. 11, 2010.

(30) Foreign Application Priority Data

Aug. 12, 2009 (JP) ................................. 2009-187353
Aug. 5, 2010 (JP) ................................. 2010-176443

(51) Int. Cl.
*G01R 33/28* (2006.01)
*G01R 33/36* (2006.01)
*G01R 33/34* (2006.01)

(52) U.S. Cl.
CPC ............ *G01R 33/28* (2013.01); *G01R 33/3685* (2013.01); *G01R 33/34015* (2013.01); *G01R 33/3657* (2013.01)

USPC ........................................... 324/322; 324/318

(58) Field of Classification Search
CPC ............ G01R 33/28; G01R 33/34015; G01R 33/3657; G01R 33/3685
USPC ............................ 324/322; 600/423; 335/296
See application file for complete search history.

(56) References Cited

U.S. PATENT DOCUMENTS 5,136,244 A * 8/1992 Jones et al. ................... 324/318
5,484,985 A   1/1996 Edelstein et al.

(Continued)

FOREIGN PATENT DOCUMENTS

JP   S61-039862 U   3/1986
JP   H04-176440 A   6/1992

(Continued)

OTHER PUBLICATIONS

Machine translation of JP2008-212437.*

(Continued)

*Primary Examiner* — Melissa Koval
*Assistant Examiner* — Rishi Patel
(74) *Attorney, Agent, or Firm* — Nixon & Vanderhye PC

(57) ABSTRACT

In a magnetic resonance imaging apparatus according to an embodiment, a transmitting coil applies a radio-frequency magnetic field to a subject placed in a static magnetic field. A receiving coil receives a magnetic resonance signal emitted from the subject owing to an application of the radio-frequency magnetic field. A balun is connected to the receiving coil, and suppresses an unbalanced current induced in the receiving coil. An overheat protection circuit indicates that the balun is abnormal when a temperature of the balun exceeds a temperature threshold. An imaging control unit stops imaging when the overheat protection circuit indicates an abnormality of the balun.

20 Claims, 10 Drawing Sheets

(56) References Cited

U.S. PATENT DOCUMENTS

| | | | |
|---|---|---|---|
| 6,239,680 B1 * | 5/2001 | Nagano et al. | 335/296 |
| 6,284,971 B1 | 9/2001 | Atalar et al. | |
| 6,297,634 B1 | 10/2001 | Aoki | |
| 2006/0122493 A1 * | 6/2006 | Atalar et al. | 600/423 |
| 2007/0078453 A1 | 4/2007 | Johnson et al. | |
| 2008/0106264 A1 * | 5/2008 | Fischer et al. | 324/322 |
| 2013/0234715 A1 | 9/2013 | Nozaki | |

FOREIGN PATENT DOCUMENTS

| | | |
|---|---|---|
| JP | 7-136145 | 5/1995 |
| JP | H07-161550 A | 6/1995 |
| JP | H07-204173 A | 8/1995 |
| JP | H11-056812 A | 3/1999 |
| JP | 2000-286126 A | 10/2000 |
| JP | 2001-284150 A | 10/2001 |
| JP | 2008-212437 | 9/2008 |
| JP | 2010-125050 A | 6/2010 |
| JP | 2011-172647 A | 9/2011 |

OTHER PUBLICATIONS

Lemke, et al., "Uveal Melanoma: Correlation of Histopathologic and Radiologic Findings by Using Thin-Section MR Imaging with a Surface Coil," *Radiology*, vol. 210, pp. 775-783 (1999).

Schueler, et al., "High resolution magnetic resonance imaging of retinoblastoma," *Opththalmol—Clinical Science*, vol. 87, pp. 330-335 (2003).

Office Action in JP Patent Application No. 2010-176443 issued May 9, 2014 with English translation.

* cited by examiner

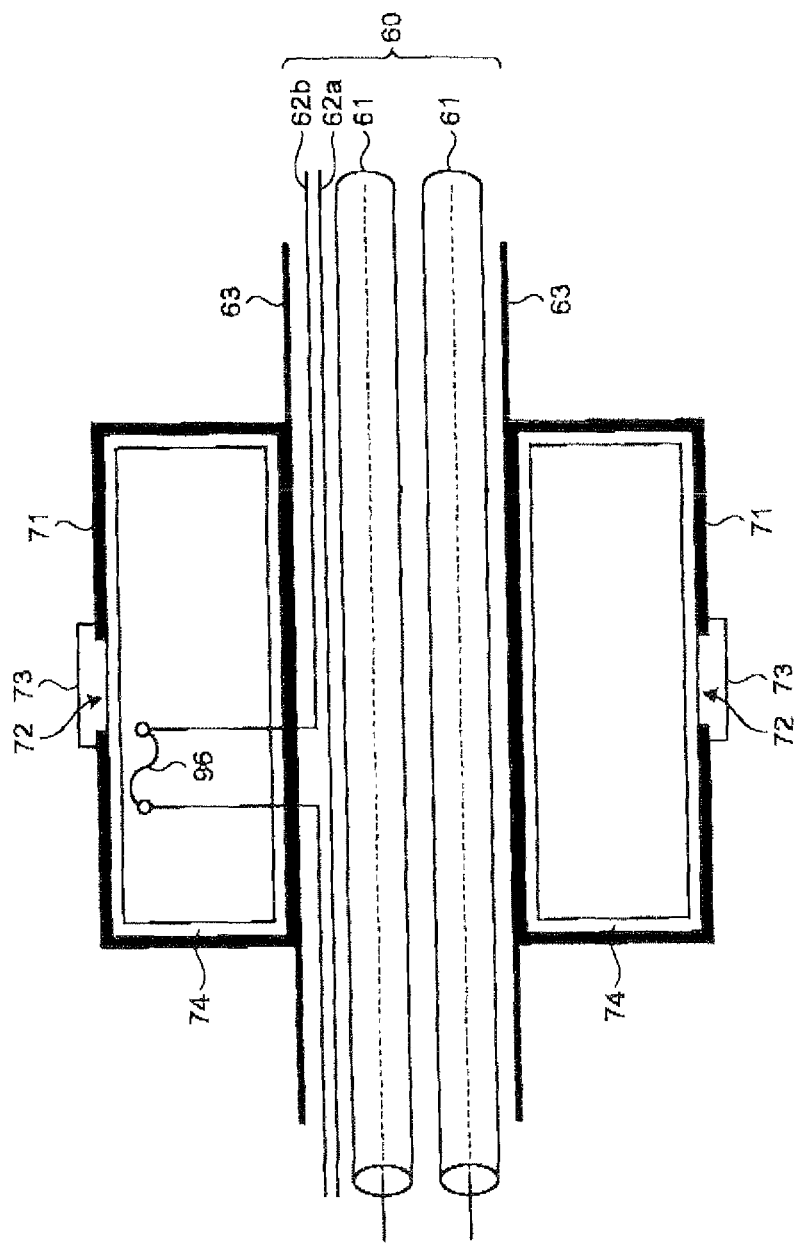

MAGNETIC RESONANCE IMAGING APPARATUS

CROSS-REFERENCE TO RELATED APPLICATIONS

This is a division of application Ser. No. 12/854,414 filed Aug. 11, 2010 (now U.S. Pat. No. 8,547,102 issued Oct. 1, 2013), which claims priority based on Japanese Patent Application No. 2009-187353 filed Aug. 12, 2009, and Japanese Patent Application No. 2010 176443 filed Aug. 5, 2010, the entire contents of each of which are hereby incorporated by reference herein.

TECHNICAL FIELD

Embodiments described herein relate generally to a magnetic resonance imaging apparatus.

BACKGROUND

A magnetic resonance imaging apparatus is an apparatus that images an inside of a subject by using a magnetic resonance phenomenon. Such magnetic resonance imaging apparatus includes a static magnetic-field magnet that generates a static magnetic field in a scan zone, a transmitting coil that applies a radio-frequency magnetic field to a subject placed in the static magnetic field, and a receiving coil that receives a magnetic resonance signal emitted from the subject owing to an application of a radio-frequency magnetic field.

In a magnetic resonance imaging apparatus, the receiving coil is generally arranged on the inner side of the transmitting coil. For this reason, when a radio-frequency magnetic field and an electric field are applied to a subject by the transmitting coil, the radio-frequency magnetic field and the electric field are also applied to the receiving coil, as a result, a current and a voltage are induced in the receiving coil. In this way, when a current and a voltage are induced in the receiving coil, a loss of electric power supplied by the transmitting coil may be produced; a spatial distribution of the radio-frequency magnetic field may become non-uniform; the receiving coil may generate heat; and/or a part of the receiving coil may be broken, in some cases.

Therefore, aiming to suppress a current and a voltage induced in a receiving coil, a magnetic resonance imaging apparatus sometimes includes a BALanced UNbalanced (BALUN) transformer in some cases (for example, see JP-A H7-136145).

However, the conventional technology described above has a possibility that when a strong current and a strong voltage beyond an assumption are induced in the receiving coil, the safety of imaging may decrease, as explained below.

Specifically, when a strong current and a strong voltage beyond an assumption are induced in the receiving coil owing to an application of a radio-frequency magnetic field and an electric field by the transmitting coil, the BALUN sometimes generates heat with the current and the voltage in some cases. When the BALUN overheats, there is a possibility that the BALUN may be broken, or a subject may suffer a burn due to heat generation of the BALUN. This is not limited to BALUNs, and similarly occurs in other electronic circuits connected to a receiving coil, for example, a trap circuit that switches between drive and stop of the receiving coil.

BRIEF DESCRIPTION OF THE DRAWINGS

FIG. 17 is a schematic diagram of a configuration of the toroidal BALUN shown in FIG. 16.

DETAILED DESCRIPTION

A magnetic resonance imaging apparatus according to an embodiment includes a transmitting coil, a receiving coil, a balanced to unbalanced transformer (BALUN, an overheat protection circuit, and an imaging control unit. The transmitting coil applies a radio-frequency magnetic field to a subject placed in a static magnetic field. The receiving coil receives a magnetic resonance signal emitted from the subject owing to an application of the radio-frequency magnetic field. The BALUN is connected to the receiving coil, and suppresses an unbalanced current induced in the receiving coil. The overheat protection circuit indicates that the BALUN is abnormal when a temperature of the BALUN exceeds a temperature threshold. The imaging control unit stops imaging when the overheat protection circuit indicates an abnormality of the BALUN.

The magnetic resonance imaging apparatus according to the embodiment will be explained below in detail with reference to the accompanying drawings. Hereinafter, the magnetic resonance imaging apparatus is referred to as the MRI apparatus.

Figure 1:
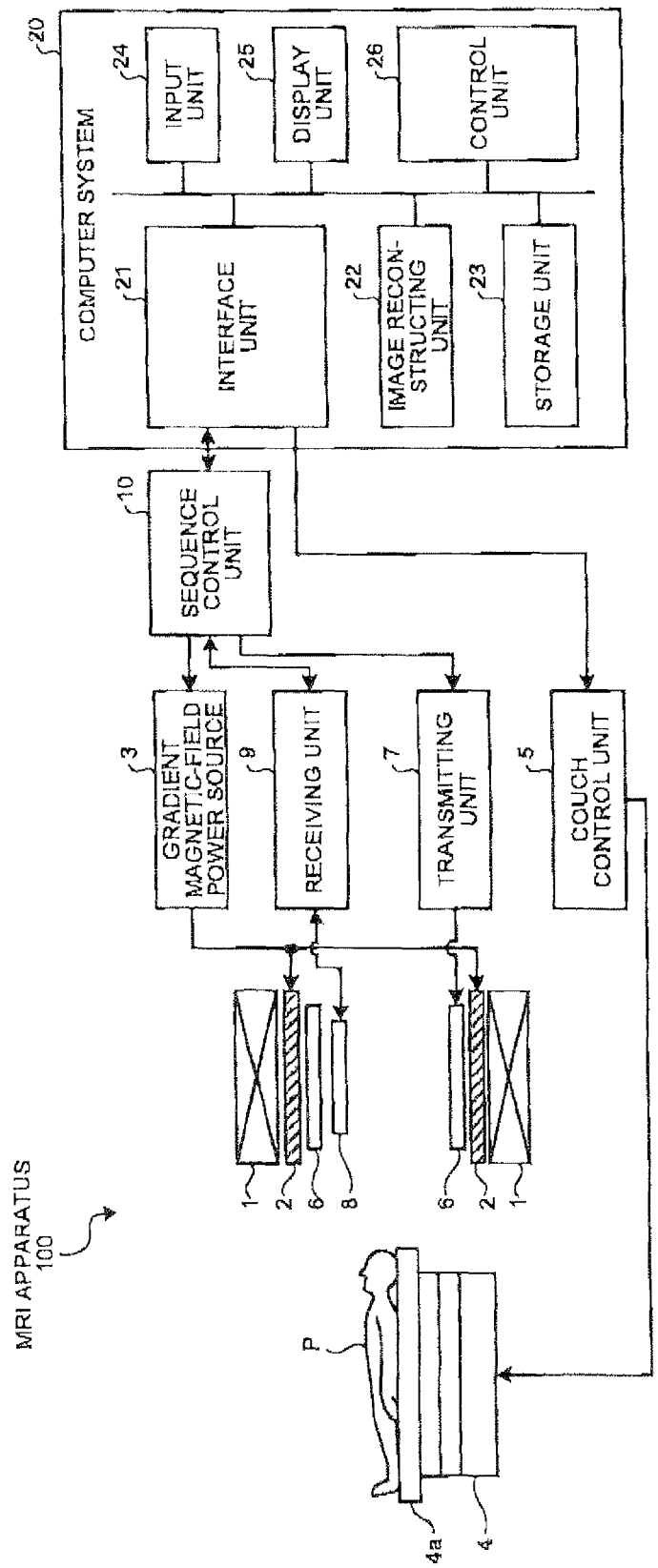
FIG. 1 is a schematic diagram of a general configuration of a Magnetic Resonance Imaging (MRI) apparatus according to an exemplary embodiment.

First of all, a general configuration of the MRI apparatus according to the embodiment is explained below. FIG. 1 is a schematic diagram for explaining a configuration of an MRI apparatus 100 according to the embodiment. As shown in FIG. 1, the MRI apparatus 100 includes a static magnetic-field magnet 1, a gradient coil 2, a gradient magnetic-field power source 3, a couchtop 4, a couch control unit 5, a transmitting coil 6, a transmitting unit 7, a receiving coil 6, a receiving unit 9, a sequence control unit 10 and a computer system 20.

The static magnetic-field magnet 1 is a magnet formed in a hollow drum shape, and generates a uniform static magnetic field in a space in its inside. As the static magnetic-field magnet 1, for example, a permanent magnet or a super conducting magnet is used.

The gradient coil 2 is a coil formed in a hollow drum shape, and is arranged on the inner side of the static magnetic-field magnet 1. The gradient coil 2 is formed of three coils in combination corresponding to x, y, and z axes orthogonal to one another, and the three coils generate respective gradient magnetic fields of which magnetic field strengths vary along the x, y and z axes, respectively, by individually receiving a current supply from the gradient magnetic-field power source 3, which will be described later. It is assumed that the z axis direction is the same direction as that of the static magnetic field. The gradient magnetic-field power source 3 is a device that supplies a current to the gradient coil 2.

The gradient magnetic fields of the x, y, and z axes generated by the gradient coil 2 correspond to, for example, a slice-selective gradient magnetic field Gs, a phase-encoding gradient magnetic field Ge, and a readout gradient magnetic field Gr, respectively. The slice-selective gradient magnetic field Gs is used for arbitrarily setting a scan cross section. The phase-encoding gradient magnetic field Ge is used for changing the phase of a magnetic resonance signal in accordance with a spatial position. The readout gradient magnetic field Gr is used for changing the frequency of a magnetic resonance signal in accordance with a spatial position.

The couchtop 4 includes a top plate 4a on which a subject P is to be placed. Under the control of the couch control unit 5, which will be described later, the couchtop 4 inserts the top plate 4a on which the subject P is placed into a hole (a scanning space) of the gradient coil 2. Usually, the couchtop 4 is placed such that the longitudinal direction of the couchtop 4 is to be parallel to the central axis of the static magnetic-field magnet 1. The couch control unit 5 is a device that controls the couchtop 4 under the control of a control unit 26, and moves the top plate 4a in the longitudinal direction and upward and downward by driving the couchtop 4.

The transmitting coil 6 is arranged on the inner side of the gradient coil 2, and generates a radio-frequency magnetic field by receiving supply of a radio-frequency pulse from the transmitting unit 7.

The transmitting unit 7 transmits a radio-frequency pulse corresponding to a Larmor frequency to the transmitting coil 6. Specifically, the transmitting unit 7 includes an oscillating unit, a phase selecting unit, a frequency converting unit, an amplitude modulating unit and a radio-frequency power amplifying unit (RF-Amp), and the like. The oscillating unit generates a radio-frequency signal of a resonance frequency unique to a subject nucleus in the static magnetic field. The phase selecting unit selects a phase of the radio-frequency signal. The frequency converting unit converts the frequency of a radio-frequency signal output by the phase selecting unit. The amplitude modulating unit modulates the amplitude of a radio-frequency signal output by the frequency modulating unit in accordance with, for example, a sin c function. The radio-frequency power amplifying unit amplifies a radio-frequency signal output by the amplitude modulating unit.

The receiving coil 8 is arranged on the inner side of the gradient coil 2, and receives a magnetic resonance signal emitted from the subject P owing to an influence of the radio-frequency magnetic field described above. Upon receiving a magnetic resonance signal, the receiving coil 8 outputs the magnetic resonance signal to the receiving unit 9.

The receiving unit 9 creates magnetic resonance data by inputting the magnetic resonance signal output by the receiving coil 8. Specifically, the receiving unit 9 includes a selector, a preamplifier, a phase detector and an analog-digital converter. The selector selectively inputs a magnetic resonance signal output from the receiving coil 8. The preamplifier amplifies a magnetic resonance signal output from the selector. The phase detector detects a magnetic resonance signal output from the preamplifier. The analog-digital converter creates magnetic resonance data by converting a signal output from the phase detector into digital.

The sequence control unit 10 performs scanning of the subject P by activating the gradient magnetic-field power source 3, the transmitting unit 7 and the receiving unit 9, based on sequence information transmitted from the computer system 20. When magnetic resonance signal data is transmitted from the receiving unit 9 as a result of scanning the subject P by activating the gradient magnetic-field power source 3, the transmitting unit 7 and the receiving unit 9; the sequence control unit 10 transfers the magnetic resonance signal data to the computer system 20.

The sequence information is information that defines a procedure for scanning, such as the strength of power to be supplied to the gradient coil 2 by the gradient magnetic-field power source 3 and the timing of supplying the power, the strength of a radio-frequency signal to be transmitted to the transmitting coil 6 by the transmitting unit 7 and the timing of transmitting the radio-frequency signal, and the timing of detecting a magnetic resonance signal by the receiving unit 9.

The computer system 20 performs total control of the MRI apparatus 100, data collection, image reconstruction and the like. The computer system 20 particularly includes an interface unit 21, an image reconstructing unit 22, a storage unit 23, an input unit 24, a display unit 25 and the control unit 26.

The interface unit 21 controls input and output of various signals that are given and received to and from the sequence control unit 10. For example, the interface unit 21 transmits sequence information to the sequence control unit 10, and receives magnetic resonance signal data from the sequence control unit 10. When having received magnetic resonance signal data, the interface unit 21 stores the received magnetic resonance signal data into the storage unit 23 with respect to each subject P.

The image reconstructing unit 22 creates spectrum data of a desired nuclear spin inside the subject P or image data, by performing post-processing, i.e., reconstruction processing, such as Fourier transform processing, on magnetic resonance signal data stored in the storage unit 23.

The storage unit 23 stores magnetic resonance signal data received by the interface unit 21, and image data created by the image reconstructing unit 22, with respect to each subject P. The storage unit 23 stores images taken by various imaging methods, such as the Black Blood method, a delay contrast-enhanced imaging method and a tagging method.

The input unit 24 receives various instructions and information input from an operator. As the input unit 24, a pointing device, such as a mouse or a trackball, a selecting device, such as a mode switch, and an input device, such as a keyboard, can be used as required.

The display unit 25 displays various information, such as spectrum data or image data, under the control of the control unit 26. A display device, such as a liquid crystal display, can be used as the display unit 25.

The control unit 26 includes a Central Processing Unit (CPU) and a memory, both of which are not shown, and carries out total control of the MRI apparatus 100. Specifically, the control unit 26 controls a scan by creating sequence information based on imaging conditions input by the operator via the input unit 24, and transmitting the created sequence information to the sequence control unit 10; and controls reconstruction of an image performed based on magnetic resonance signal data sent from the sequence control unit 10 as a result of the scan.

Figure 2:
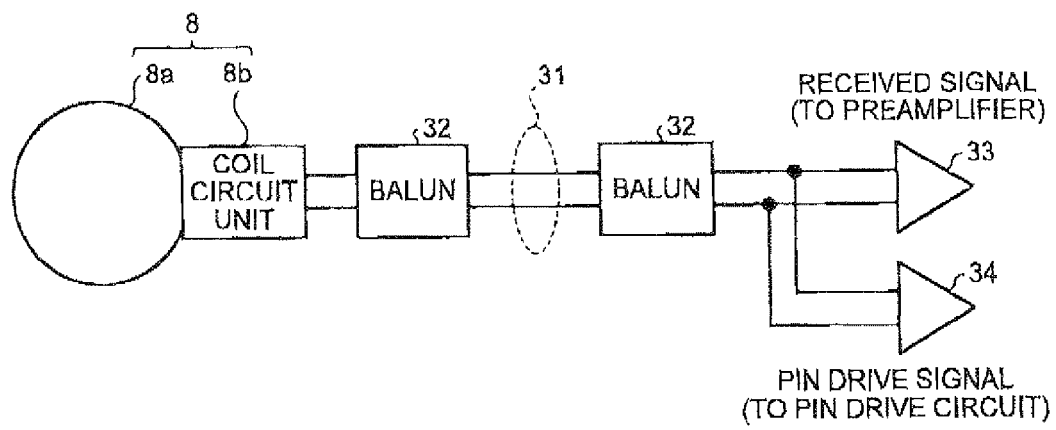
FIG. 2 is a schematic diagram for explaining details of a receiving coil according to the exemplary embodiment.

Details of the receiving coil 8 are explained below. FIG. 2 is a schematic diagram for explaining details of the receiving coil 8. Although one unit of the receiving coil 8 is explained below as an example, the MRI apparatus 100 includes a plurality of receiving coils 8, such as a receiving coil for head, a receiving coil for abdomen and a receiving coil for spine. As shown in the figure, the receiving coil 8 includes a coil loop unit 8a and a coil circuit unit 8b.

The coil loop unit 8a detects a magnetic resonance signal emitted from the subject owing to an application of a radio-frequency magnetic field by the transmitting coil 6. The coil loop unit 8a is connected to a coaxial cable 31 via the coil circuit unit 8b. A plurality of BALUNs 32 is inserted at predetermined points in the coaxial cable 31.

The coil circuit unit 8b controls detection of a magnetic resonance signal by the coil loop unit 8a. The coil circuit unit 8b is connected to a received signal preamplifier 33 and a PIN-drive signal preamplifier 34 via the coaxial cable 31. The coaxial cable 31 transmits a received signal and a PIN drive signal in a superimposed manner. The cable used in the embodiment is not limited to a coaxial cable, and can be a cable which includes a shield, for example, such as a composite cable shown in FIG. 13.

The received signal preamplifier 33 and the PIN-drive signal preamplifier 34 are included in the receiving unit 9. Although not shown in FIG. 2, the received signal preamplifier 33 is connected to a receiving circuit that processes a received signal (magnetic resonance signal) received by the receiving coil 8. The PIN-drive signal preamplifier 34 is connected to a PIN drive circuit that controls driving of the receiving coil 8 by using a PIN drive signal.

Figure 3:
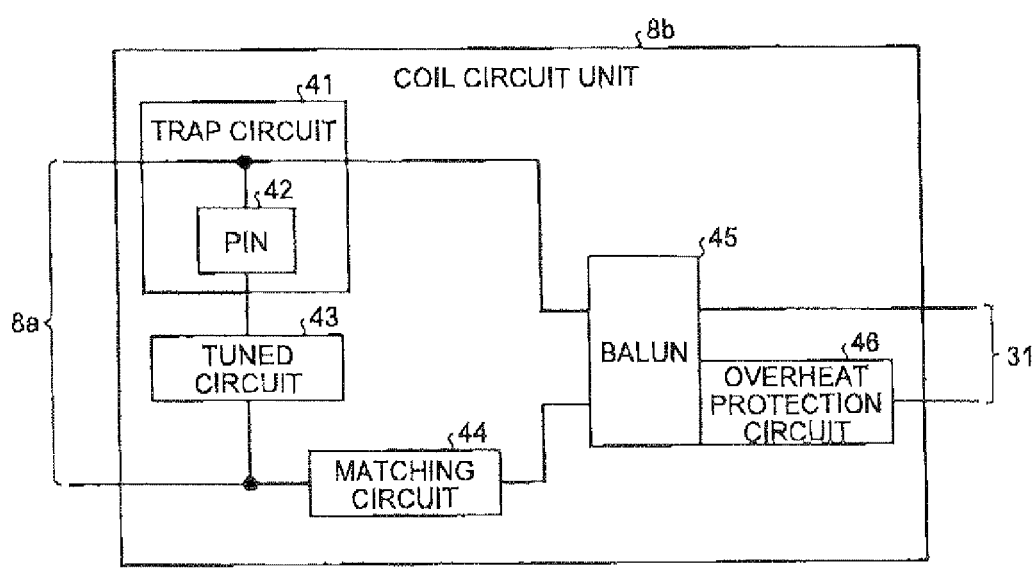
FIG. 3 is a functional block diagram of a configuration of a coil circuit unit according to the exemplary embodiment.

The coil circuit unit 8b is explained below in detail. FIG. 3 is a functional block diagram of a configuration of the coil circuit unit 8b. As shown in the figure, specifically, the coil circuit unit 8b includes a trap circuit 41, a PIN diode 42, a tuned circuit 43, a matching circuit 44, a BALUN 45, and an overheat protection circuit 46.

The trap circuit 41 includes an active trap circuit and a passive trap circuit, and operates the circuits, thereby protecting the receiving circuit during a transmission of a radio-frequency magnetic field. The PIN diode 42 activates the active trap circuit of the trap circuit 41 when a PIN drive signal is passed from the PIN drive circuit. The receiving coil 8 is configured such that even when the active trap circuit is not activated during the transmission of a radio-frequency magnetic field, the passive trap circuit is activated, thereby being capable to protect the receiving circuit. The tuned circuit 43 matches a resonance frequency of the receiving coil 8 to a Larmor frequency. The matching circuit 44 performs impedance matching between the receiving coil 8 and the received signal preamplifier 33.

Figure 4:
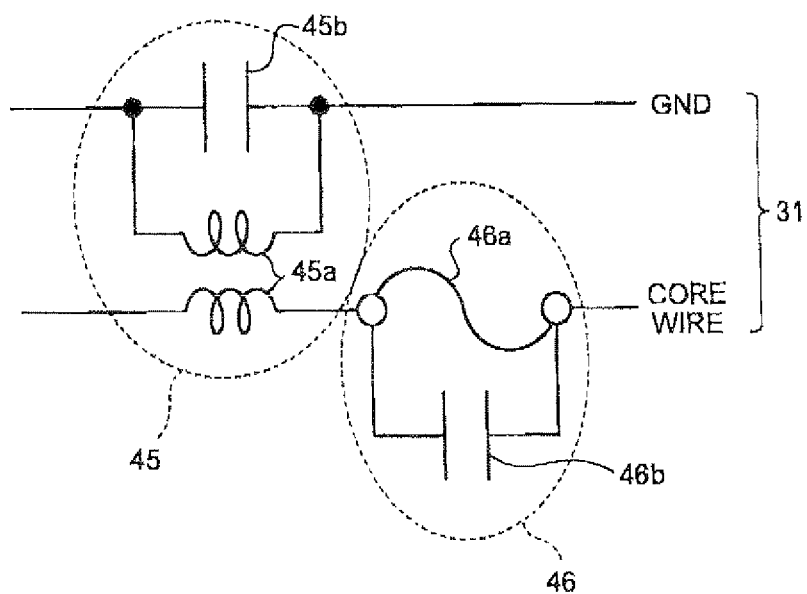
FIG. 4 is a schematic diagram that depicts details of a BALanced UNbalanced (BUM) and an overheat protection circuit according to the exemplary embodiment.

The BALUN 45 suppresses an unbalanced current induced to the receiving coil 8. The overheat protection circuit 46 indicates that the BALUN 45 is abnormal when the temperature of the BALUN 45 exceeds a temperature threshold. FIG. 4 is a schematic diagram that depicts details of the BALUN 45 and the overheat protection circuit 46. Although the BALUN 45 and the overheat protection circuit 46 included in the coil circuit unit 8b are explained below as an example, each of the BALUNs 32 inserted in the coaxial cable 31 is also provided with the overheat protection circuit 46.

As shown in FIG. 4, specifically, the BALUN 45 includes coils 45a each of which is formed by winding a coaxial cable, and a capacitor 45b that is connected in parallel with the coils 45a. When unbalanced currents pass through the coils 45a, magnetic fluxes generated with respective currents passing through the GND side and the core-wire side cancel each other out, consequently, the coils 45a do not work as a coil; and when an unbalanced current passes only through the GND side, the coil 45a works as a coil. Therefore, when an unbalanced current passes only through the GND side, the coil 45a and the capacitor 45b operate as a parallel resonance circuit. When operating as a parallel resonance circuit, the coil 45a and the capacitor 45b are adjusted to have a high impedance to match with the frequency of an induced voltage generated in the receiving coil 8 when transmitting a radio-frequency magnetic field by the transmitting coil 6. Accordingly, an unbalanced current passing through the GND side in the coaxial cable 31 can be suppressed.

On the other hand, the overheat protection circuit 46 includes a temperature fuse 46a and a capacitor 46b that are connected in parallel. The overheat protection circuit 46 is inserted on the core-wire side in the coaxial cable 31, and arranged in the vicinity of the BALUN 45. When the temperature of heat generated by the BALUN 45 exceeds a temperature threshold, the temperature fuse (an electrical safety device, which interrupts electric current when heated to a specific temperature, with a one-time fusible link) 46a fuses, and turns to an open state. The capacitor 46b is connected in parallel with the temperature fuse 46a.

Figure 5:
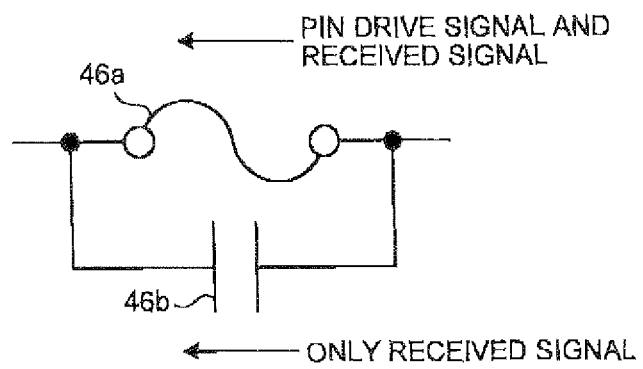
FIG. 5 is a schematic diagram for explaining operation of the overheat protection circuit according to the exemplary embodiment.

Operation of the overheat protection circuit 46 is explained below. FIG. 5 is a schematic diagram for explaining operation of the overheat protection circuit 46. A received signal received by the receiving coil 8 is a radio-frequency signal, and a PIN drive signal transmitted by the PIN drive circuit is a direct-current signal. For this reason, when the temperature fuse 46a is in continuity, as shown in FIG. 5, a received signal passes through each of the temperature fuse 46a and the capacitor 46b, and a PIN drive signal passes through only the temperature fuse 46a.

On the other hand, when the temperature fuse 46a turns to an open state due to overheat of the BALUN 45, a flow of a PIN drive signal is cut off. As described above, even when a flow of a PIN drive signal is cut off, the receiving circuit is protected by the passive trap circuit during a transmission. Accordingly, when the temperature fuse 46a turns to an open state, only a received signal passes through via the capacitor 46b. In other words, when the temperature fuse 46a turns to an open state from a continuous state due to overheat of the BALUN 45, a PIN drive signal does not pass through the receiving coil 8, while a received signal passes through the receiving circuit.

Accordingly, even when the BALUN 45 is overheated and then the temperature fuse 46a turns to an open state, a magnetic resonance signal received by the receiving coil 8 can be processed. In other words, even after the BALUN 45 is overheated and then the temperature fuse 46a turns to an open state, a scan can be continued.

Figure 6:
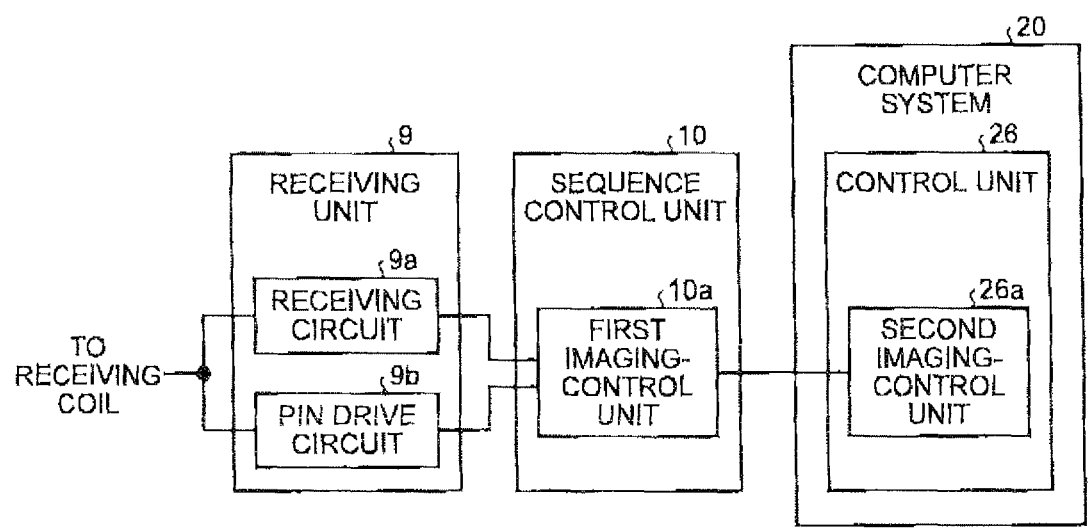
FIG. 6 is a functional block diagram of a detailed configuration of a receiving unit, a sequence control unit, and a control unit according to the exemplary embodiment.

Details of the receiving unit 9, the sequence control unit 10, and the control unit 26 are explained below. FIG. 6 is a functional block diagram of a detailed configuration of the receiving unit 9, the sequence control unit 10, and the control unit 26. As shown in the figure, the receiving unit 9 includes a receiving circuit 9a and a PIN drive circuit 9b, in addition to the above described function.

The receiving circuit 9a processes a received signal (magnetic resonance signal) received by the receiving coil 8. The PIN drive circuit 9b controls driving of the receiving coil 8 by using a PIN drive signal.

The sequence control unit 10 includes a first imaging-control unit 10a in addition to the above described above function. The first imaging-control unit 10a executes a scan by driving the gradient magnetic-field power source 3, the transmitting unit 7, and the receiving unit 9, based on sequence information transmitted from the computer system 20.

After that, when an abnormality of a PIN drive signal is produced by the overheat protection circuit 46, and when the receiving coil 8 with the produced abnormality of the PIN drive signal is a specific receiving coil, the first imaging-control unit 10a immediately stops the scan. The specific receiving coil here is, for example, a receiving coil of which temperature may rise in a short time. It is assumed that which of the receiving coils 8 is the specific receiving coil is preliminarily set in the apparatus.

Moreover, when the first imaging-control unit 10a stops a scan, the first imaging-control unit 10a notifies the computer system 20 that the scan is stopped; and when an abnormality of a PIN drive signal is produced, the first imaging-control unit 10a notifies the computer system 20 that the abnormality of the PIN drive signal is produced.

The control unit 26 of the computer system 20 includes a second imaging-control unit 26a in addition to the above described function. The second imaging-control unit 26a creates sequence information based on imaging conditions input from an operator via the input unit 24, and transmits the created sequence information to the sequence control unit 10, thereby executing a scan. The second imaging-control unit 26a executes a prescan for measuring the level of a received signal and other conditions, and a main scan for collecting imaging data, continuously in one time of an imaging protocol.

Moreover, while imaging, when it is notified from the sequence control unit 10 that a scan is stopped, or that an abnormality of a PIN drive signal is produced; the second imaging-control unit 26a displays onto the display unit 25 an error message indicating the notified contents. Furthermore, the second imaging-control unit 26a stops a scan depending on conditions.

Figure 7:
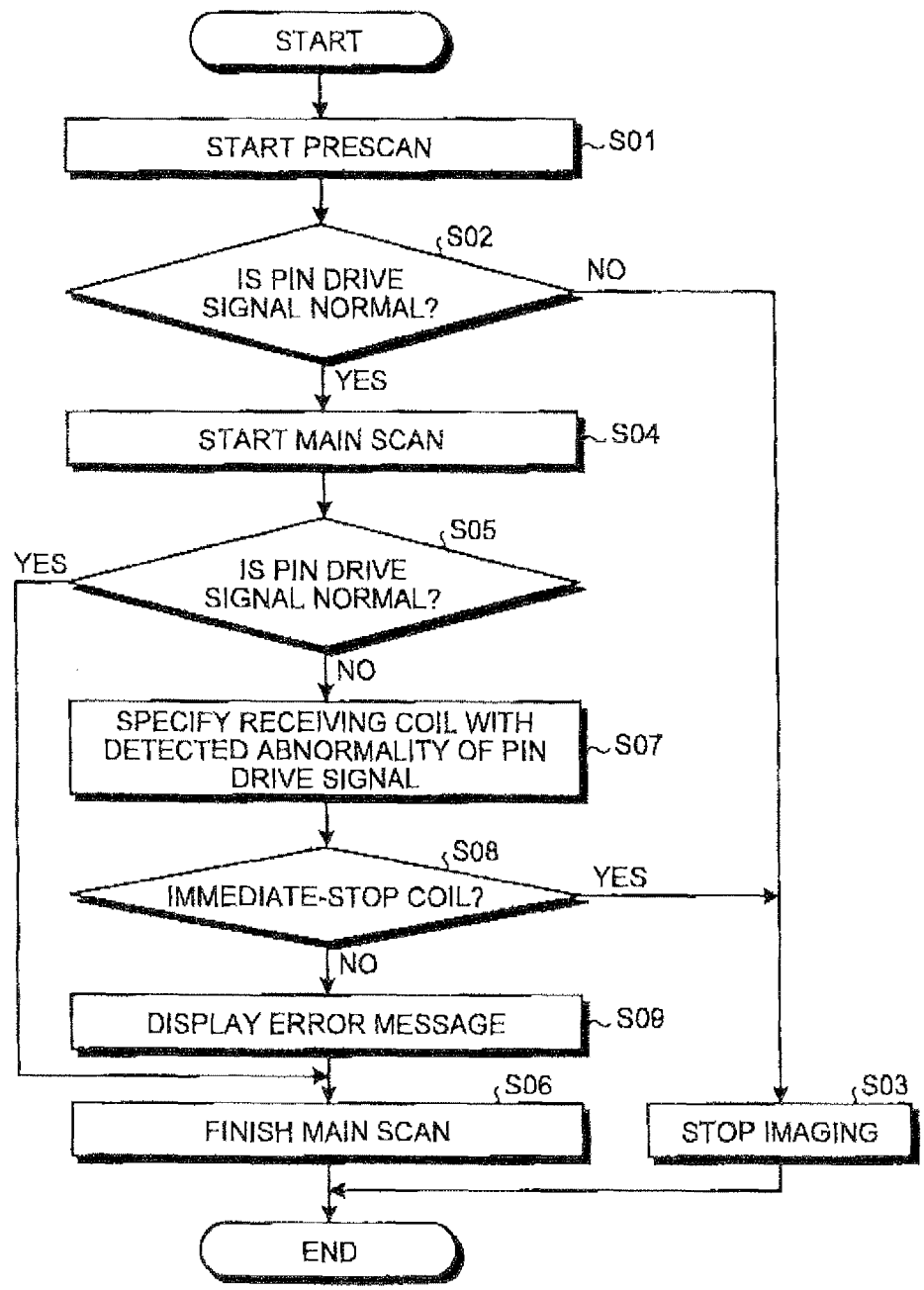
FIG. 7 is a flowchart of a process procedure of imaging control by the MRI apparatus according to the exemplary embodiment.

A process procedure of the imaging control by the MRI apparatus 100 according to the embodiment is explained below. FIG. 7 is a flowchart of a process procedure of the imaging control by the MK apparatus 100 according to the embodiment. The processing shown in the figure describes a series of processes related to a prescan and a main scan that are to be performed in one time of an imaging protocol, and when repeatedly performing a plurality of imaging protocols, the series of the processes are to be repeatedly executed. A specific receiving coil to be a target according to which imaging is immediately stopped is hereinafter referred to as an "immediate-stop coil".

According to the MRI apparatus 100 of the embodiment, as shown in FIG. 7, to begin with, a prescan is started as the second imaging-control unit 26a of the computer system 20 transmits sequence information about the prescan to the sequence control unit 10 (Step S01).

In the sequence control unit 10, when the first imaging-control unit 10a receives a PIN drive signal from the PIN drive circuit 9b before performing the prescan and while performing the prescan, the first imaging-control unit 10a determines whether the received PIN drive signal is normal (Step S02).

if the PIN drive signal is normal (Yes at Step S02); the first imaging-control unit 10a starts a main scan by transmitting sequence information about the main scan to the sequence control unit 10 (Step S04).

By contrast, if the PIN drive signal is abnormal (No at Step S02); the first imaging-control unit 10a stops imaging without performing main scan (Step S03).

Moreover, during the execution of the main scan, when the first imaging-control unit 10a receives a PIN drive signal from the PIN drive circuit 9b, the first imaging-control unit 10a determines whether the received PIN drive signal is normal (Step S05).

If the PIN drive signal is normal (Yes at Step S05); the first imaging-control unit 10a continues the imaging, and finishes the main scan (Step S06).

By contrast, if the PIN drive signal is abnormal (No at Step S05); the first imaging-control unit 10a specifies a receiving coil with the detected abnormality of the PIN drive signal (Step S07); and then determines whether the specified receiving coil is an immediate-stop coil (Step S08).

If the specified receiving coil is an immediate-stop coil (Yes at Step S08); the first imaging-control unit 10a immediately stops the imaging (Step S03).

By contrast, if the specified receiving coil is not immediate-stop coil (No at Step S08); the first imaging-control unit 10a displays an error message onto the display unit 25 via the second imaging-control unit 26a (Step S09); and continues the imaging, and finishes the main scan (Step S06). In such case, because the PIN drive signal is abnormal, the second imaging-control unit 26a causes the next imaging protocol not to be executed.

In this way, according to the MRI apparatus 100, when an abnormality of a PIN drive signal is produced by the overheat protection circuit 46, and when a receiving coil with the produced abnormality of the PIN drive signal is an immediate-stop coil, the first imaging-control unit 10a included in the sequence control unit 10 immediately stops imaging. When a receiving coil with the produced abnormality of the PIN drive signal is not an immediate-stop coil, the second imaging-control unit 26a included in the computer system 20 stops imaging when an imaging protocol in execution is completed.

As described above, the MRI apparatus 100 according to the embodiment includes the transmitting coil 6 that applies a radio-frequency magnetic field onto a subject placed in a static magnetic field, the receiving coil 8 that receives a magnetic resonance signal emitted from the subject owing to the application of the radio-frequency magnetic field by the transmitting coil 6, and the BALUN 45 connected to the receiving coil 8. Furthermore, the MRI apparatus 100 includes the overheat protection circuit 46 that indicates that the BALUN 45 is abnormal when the temperature of the BALUN 45 exceeds a temperature threshold, and the first imaging-control unit 10a and the second imaging-control unit 26a each of which stops imaging when an abnormality of a PIN drive signal is produced by the overheat protection circuit 46. Therefore, according to the embodiment, even when a strong current and a strong voltage beyond an assumption are induced to a receiving coil, the safety in imaging can be improved by preventing overheat of an electronic circuit connected to the receiving coil.

Although the embodiment is explained above in a case where when a specified coil is an immediate-stop coil, imaging is immediately stopped upon occurrence of an abnormality of a PIN drive signal, embodiments are not limited to this. For example, it can be configured to determine whether to stop imaging immediately, or to stop imaging when an imaging protocol in execution is completed, depending on remaining imaging time or type of imaging method.

In such case, when an abnormality of a PIN drive signal is produced by the overheat protection circuit 46, and when imaging in execution is being performed by a specific imaging method, the first imaging-control unit 10a included in the sequence control unit 10 immediately stops the imaging. When imaging in execution is executed by an imaging method other than a specific imaging method, or when an estimated temperature at the termination of a protocol does not exceed a temperature threshold, the second imaging-control unit 26a included in the computer system 20 stops the imaging when the imaging protocol in execution is completed. The "estimated temperature" here is calculated by, for example, "radio-frequency output×remaining imaging time× coefficient". The "radio-frequency output" here is, for example, a magnitude of electric power (W) output from the received signal preamplifier 33, and a magnitude of electric power (W) supplied to the transmitting coil 6.

Accordingly, for example, in a case of an imaging method by which imaging can be re-executed after dealing with a point of abnormality produced due to overheat by replacing it, the imaging can be immediately stopped. On the other hand, for example, in a case of imaging using a contrast agent, when an imaging time is short (an estimated temperature at the imaging termination is lower than a threshold), which means an imaging method unable to re-execute imaging immediately, the imaging can be continued until the imaging protocol is completed.

The embodiment is explained below in a case where the overheat protection circuit 46 includes the temperature fuse 46a and the capacitor 46b that are connected in parallel. However, embodiments are not limited to this. Modifications of the overheat protection circuit are explained below with reference to FIGS. 8-11.

Figure 8:
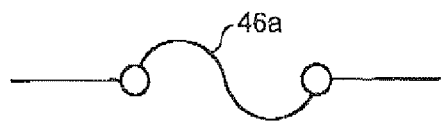
FIGS. 8-11 are schematic diagrams for explaining modifications of the overheat protection circuit according to the exemplary embodiment.

First of all, for example, as shown in FIG. 8, a circuit in which the capacitor 46b is removed and only the temperature fuse 46a is included can be used as an overheat protection circuit. In such case, when the temperature fuse 46a operates, not only a PIN drive signal, but also a received signal is cut off, so that imaging is immediately stopped.

Figure 9:
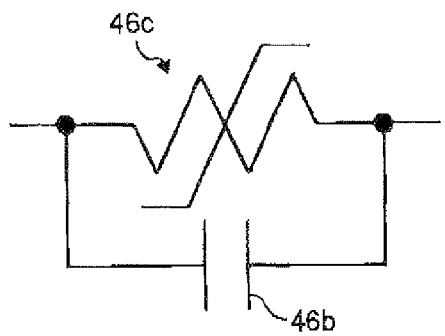

Alternatively, for example, as shown in FIG. 9, a circuit that includes a Positive Temperature Coefficient (PTC) element 46c can be used as an overheat protection circuit, instead of the temperature fuse 46a. As the PTC element 46c here, for example, a POLYSWITCH (registered trademark) can be used. Although the PTC element 46c sometimes uses a magnetic material in some cases, the PTC element 46c in a small size with little effect of the magnetic material has a large direct-current resistance value. When the direct-current resistance value of the PTC element 46c is large, as the capacitor 46b with a large capacity is connected in parallel, so that a received signal passes through the capacitor. Accordingly, a loss of a received signal can be reduced. Because a PIN drive signal has a relatively greater allowance with respect to a current and a voltage compared with a received signal, the PTC element 46c can be used even when its resistance value is high to a certain extent.

Moreover, although the embodiment is explained above in a case where the overheat protection circuit 46 is inserted on the core-wire side in the coaxial cable 31, the overheat protection circuit 46 can be inserted on the GND (Shield) side. However, because an unbalanced current passes through on the GND side in the coaxial cable 31, when an overheat protection circuit including a temperature fuse is provided, there is a possibility that an unbalanced current may exceed a rated value of the temperature fuse.

Figure 10:
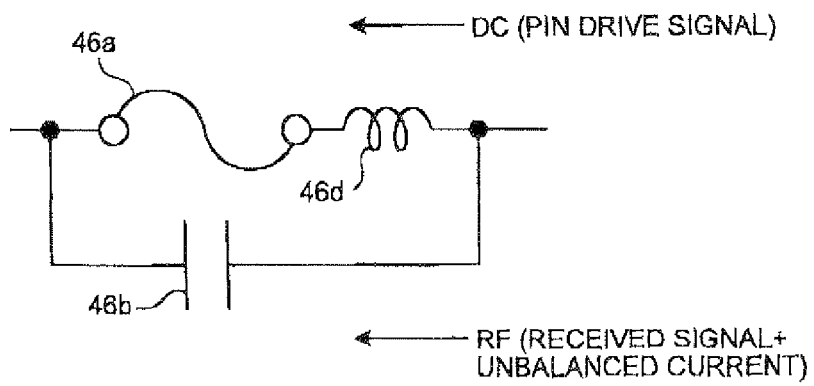
Figure 11:
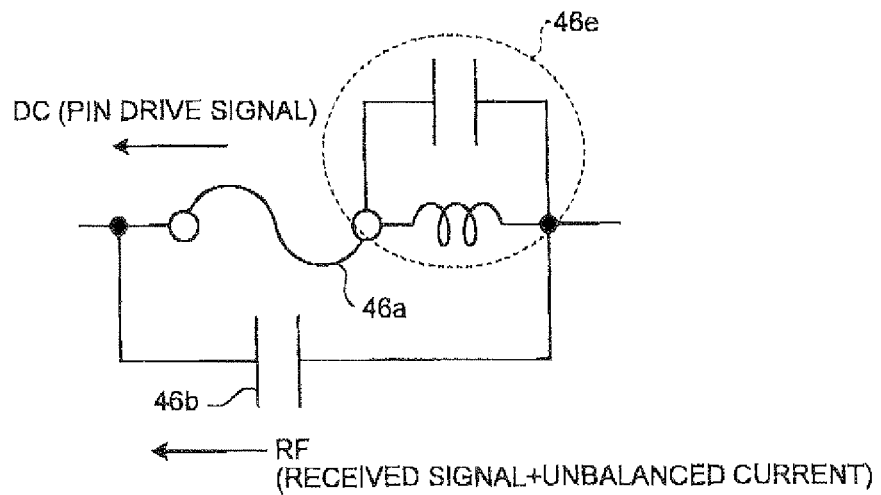

For this reason, when an overheat protection circuit including a temperature fuse is connected on the GND side in the coaxial cable 31, for example, as shown in FIG. 10, a coil 46d is serially connected to the temperature fuse 46a. Alternatively, as shown in FIG. 11, a parallel resonance circuit 46e is connected to the temperature fuse 46a in series. Accordingly, an unbalanced current that is a radio-frequency passes through on the side of the capacitor 46b, the passage of an unbalanced current through the side of the temperature fuse 46a can be controlled. Because a PIN drive signal is a direct current, increase in the impedance can be ignored.

The embodiment is explained above in a case where the overheat protection circuit 46 is arranged in the vicinity of the BALUN 45 in order to detect overheat of the BALUN 45, embodiments are not limited to this. For example, an overheat protection circuit can be arranged in the vicinity of a trap circuit instead of the BALUN 45.

Figure 12:
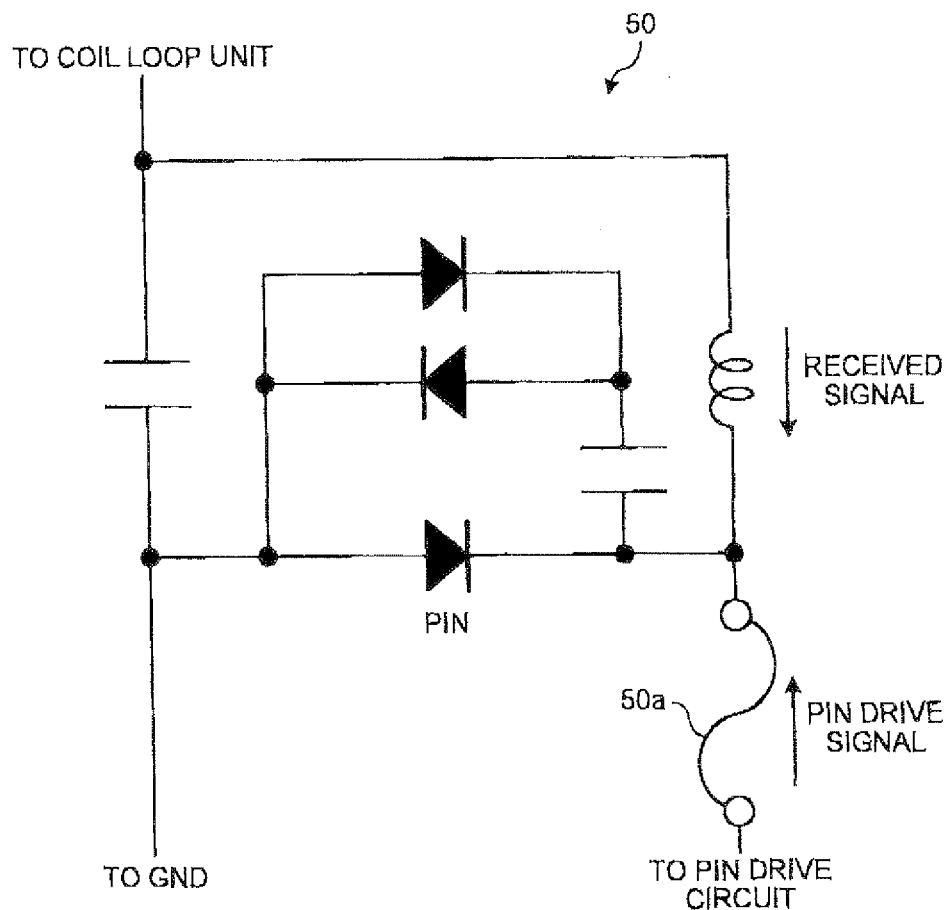
FIG. 12 is a schematic diagram for explaining a case where an overheat protection circuit is arranged in a vicinity of a trap circuit according to the exemplary embodiment.

FIG. 12 is a schematic diagram for explaining a case where an overheat protection circuit is arranged in the vicinity of a trap circuit. As shown in the figure, when an overheat protection circuit 50a is arranged in the vicinity of a trap circuit 50, for example, the overheat protection circuit 50a is provided at an input end from which a PIN drive signal is input from the PIN drive circuit. The example shown in the figure depicts a case of using an overheat protection circuit that includes only a temperature fuse.

When the overheat protection circuit 50a is provided to the trap circuit 50, it is configured such that the first imaging-control unit 10a of the sequence control unit 10 immediately stops imaging when an abnormality is detected by the overheat protection circuit 50a. Accordingly, even when the trap circuit 50 is overheated as a strong voltage beyond an assumption is induced in the receiving coil 8, it can prevent the trap circuit 50 from a failure, and a subject from suffering burns due to heat generated by the trap circuit 50.

The technology according to the embodiment can be similarly applied to other than a BALUN and a trap circuit, for example, a cross diode used for overheat protection, and a choke coil used for the same purpose as a BALUN.

Recently, a phased array coil that includes a plurality of coil elements is sometimes used as a receiving coil. The phased array coil often uses a composite cable. The composite cable is a cable that accommodates a plurality of coaxial cables and/or solid wires inside a shield.

Figure 13:
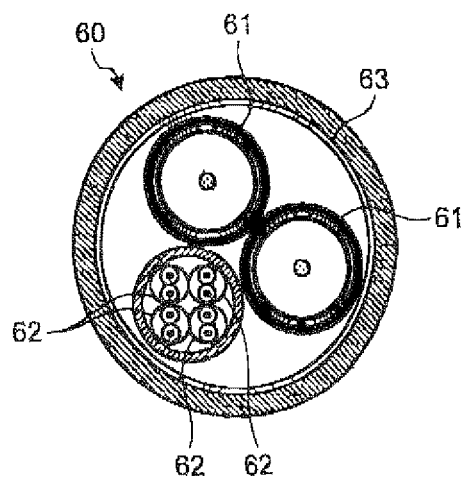
FIG. 13 is a cross-sectional view that depicts an example of a composite cable according to the exemplary embodiment.

FIG. 13 is a cross-sectional view that depicts an example of a composite cable. As shown in FIG. 13, a composite cable 60 includes a plurality of coaxial cables 61, a plurality of solid wires 62 and a shield 63. The shield 63 is formed into a cylindrical shape and includes the coaxial cables 61 and the solid wires 62 in a tube. Although the composite cable 60 that includes two of the coaxial cables 61 and four of the solid wires 62 is shown in FIG. 13 as an example, the number of the coaxial cables 61 and the number of the solid wires 62 to be accommodated in the composite cable 60 are not limited to these. Moreover, the composite cable 60 can accommodate only the coaxial cables 61, or only the solid wires 62.

When using such composite cable, a toroidal SALON is often used as a countermeasure against an unbalanced current passing through the cable. The toroidal BALUN is configured to control a magnetic field generated by an unbalanced current, thereby controlling the unbalanced current.

Figure 14:
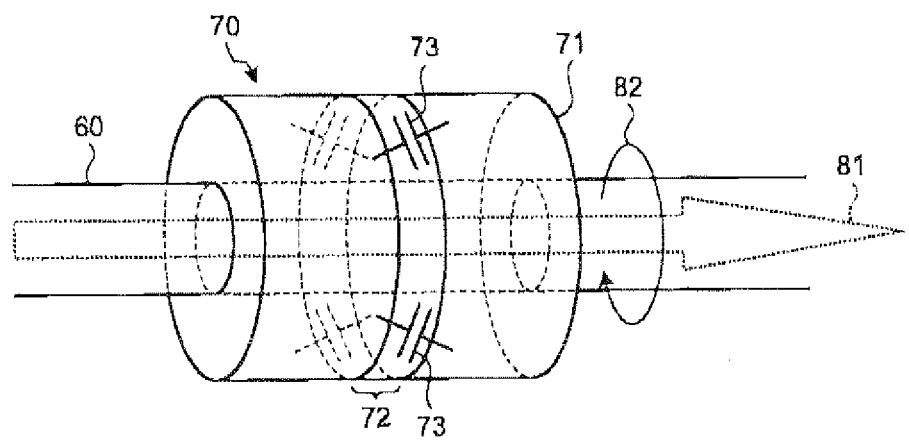
FIG. 14 is a schematic diagram of a structure of a toroidal BALUN according to the exemplary embodiment.
Figure 15:
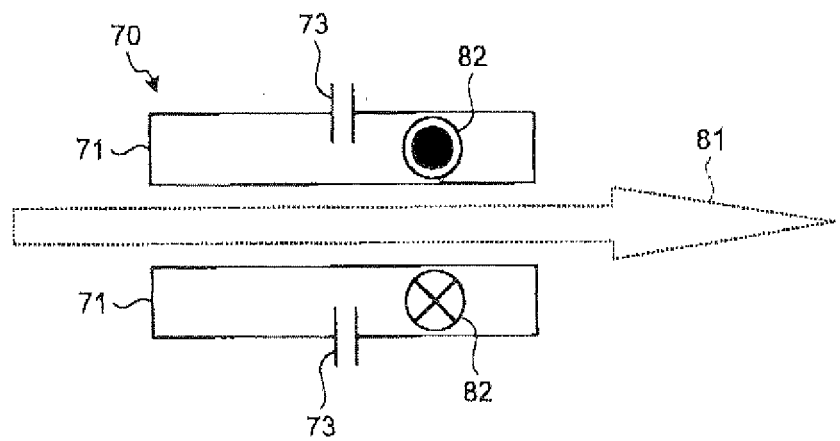
FIG. 15 is a circuit diagram of the toroidal BALUN according to the exemplary embodiment.

FIG. 14 is a schematic diagram of a structure of a toroidal BALUN. FIG. 15 is a circuit diagram of the toroidal BALUN. As shown in FIG. 14, for example, a toroidal BALUN 70 includes a conductor 71 in a cylindrical shape that is formed hollow or by filling, such as Teflon (registered trademark), inside a peripheral wall. On a part of an outer circumference of the conductor 71, a slit 72 is formed in the circumferential direction, and a predetermined number of capacitors 73 are provided so as to bridge the slit 72. The toroidal BALUN 70 configured in this way is mounted so as to surround part of the composite cable 60 with the conductor 71. The shield 63 of the composite cable 60 and the conductor 71 are then soldered, thereby being electrically connoted connected to each other.

When an unbalanced current 81 passes through the shield 63 of the composite cable 60, a magnetic field (a magnetic flux 82 shown in FIG. 14) is generated with the unbalanced current 81. The toroidal BALUN 70 is adjusted so as to resonate with the frequency of the unbalanced current 81. When the magnetic field is generated, a current passes through the conductor 71 of the toroidal BALUN 70 owing to mutual induction, and then an inverse current is generated so as to cancel the current. As a result, the magnetic field is canceled out, unbalanced current does not pass through. In other words, as shown in FIG. 15, according to the toroidal BALUN 70, the conductor 71 works as an inductor and the magnetic flux 82 is blocked by a resonance circuit including the conductor 71 and the capacitor 73 so that unbalanced current is controlled.

An overheat protection circuit can be applied to the toroidal BALUN 70 configured in this way. In the toroidal BALUN 70, when unbalanced current is suppressed, the capacitor 73 generates the most heat. Therefore, for example, an overheat protection circuit is provided in the vicinity of the capacitor 73, whereby overheat of the capacitor 73, i.e., overheat of the toroidal BALUN 70 is detected.

Figure 16:
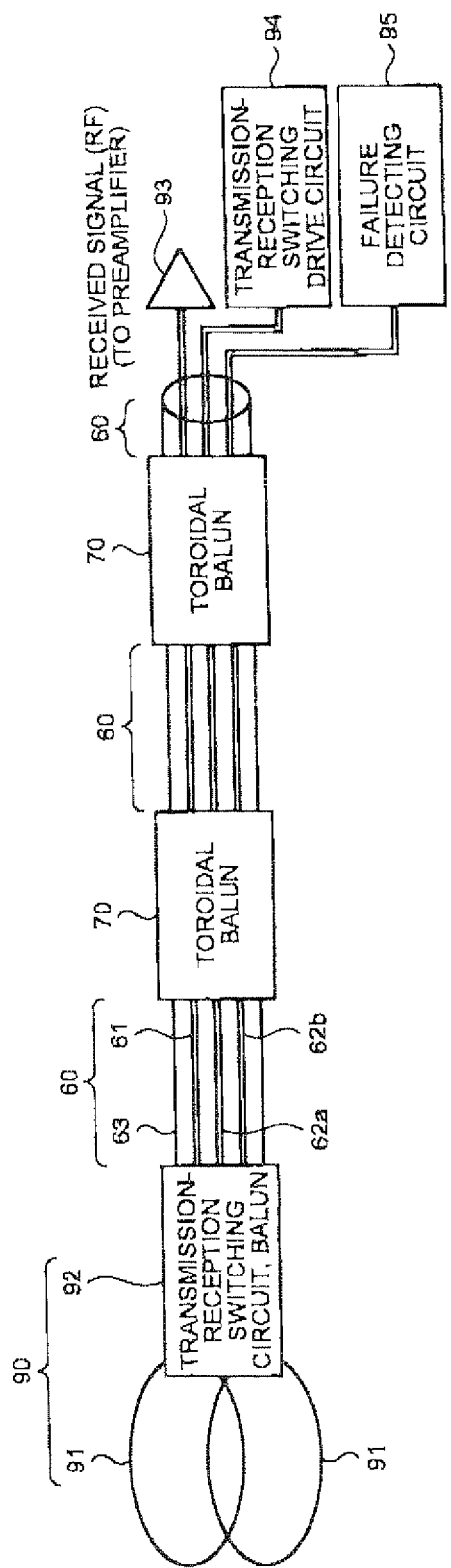
FIG. 16 is a schematic diagram of a general configuration when an overheat protection circuit is applied to the toroidal BALUN according to the exemplary embodiment.

FIG. 16 is a schematic diagram of a configuration when an overheat protection circuit is applied to the toroidal BALUN 70. As shown in FIG. 16, for example, a phased array coil 90 includes a plurality of coil loop units 91 and a transmission-reception switching circuit 92. The transmission-reception switching circuit 92 is provided with, for example, the BALUN 45 and the overheat protection circuit 46 shown in FIG. 3. The transmission-reception switching circuit 92 is connected to a preamplifier 93, transmission-reception switching drive circuits 94 and a failure detecting circuit 95, via the composite cable 60.

The composite cable 60 includes, for example, the coaxial cables 61, solid wires 62a and 62b, and the shield 63. The coaxial cables 61 transmit received signals (Radio Frequency (RF)) received by the coil loop units 91 to the preamplifier 93. The solid wire 62a transmits a switching signal for controlling switching of the transmission-reception of the coil loop units 91 from the transmission-reception switching drive circuits 94 to the transmission-reception switching circuit 92. The shield 63 includes the coaxial cables 61 the solid wires 62a and 62b in its inside. Although not shown in FIG. 16, the coaxial cable 61 and the transmission-reception switching drive circuit 94 are provided to each of the coil loop units 91. The number of coil loops can be one or more. A predetermined number of the toroidal BALUNs 70 are mounted onto the composite cable 60.

FIG. 17 is a schematic diagram of a configuration of the toroidal BALUN 70 shown in FIG. 16. As shown in FIG. 17, the toroidal BALUN 70 includes a printed circuit board 74 that is formed hollow or by filling, such as Teflon (registered trademark), inside a peripheral wall, and a copper foil is formed as the conductor 71 over the surface of the printed circuit board 74. On a part of an outer circumference of the conductor 71, the slit 72 is formed in the circumferential direction (a plane vertical to the cable) of the printed circuit board 74, and the capacitors 73 are provided so as to bridge the slit 72. The conductor 71 is then soldered to the shield 63 of the composite cable 60 on the inner circumference side of the printed circuit board 74, thereby being electrically connected.

In the toroidal BALUN 70 configured in this way, when unbalanced current is suppressed, the capacitor 73 generates the most heat. For this reason, as shown in FIG. 17, a temperature fuse 96 is provided in the vicinity of the capacitor 73, as an overheat protection element. The temperature fuse 96 is wired with a twist pair cable, in order to avoid influence of magnetic flux of the toroidal BALUN 70. One of the electric wires protected by the shield 63 is connected to the temperature fuse 96, for example, and used for overheat detection. In the example shown in FIG. 17, the solid wire 62b included in the composite cable 60 is used as an electric wire for overheat detection.

Returning to FIG. 16, one end of the solid wire 62b is connected to the overheat protection circuit provided in the transmission-reception switching circuit 92, and the other end is connected to the failure detecting circuit 95 via the temperature fuses 96 provided in the two of the toroidal BALUNs 70. Accordingly, as the failure detecting circuit 95 detects a cutoff of the temperature fuse 96 by using the solid wire 62b, overheat of the capacitor 73 included in the toroidal BALUN 70 can be detected.

Although it is explained above in a case where the electric wire connected to the temperature fuse 96 is dedicated to detect overheat of the toroidal BALUN 70, the electric wire can be used also as an electric wire for transmitting a switching signal of the coils.

As described above, according to the embodiment, overheat protection can be performed also against overheat of a toroidal BALUN.

While certain embodiments have been described, these embodiments have been presented by way of example only and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, said apparatus comprising:
a transmitting coil configured to apply a radio-frequency magnetic field to a subject placed in a static magnetic field;
a receiving coil configured to receive a magnetic resonance signal emitted from the subject in response to application of the radio-frequency magnetic field by the transmitting coil;
an electronic circuit configured to be connected to the receiving coil; and
an overheat protection circuit configured to include a temperature fuse arranged between the receiving coil and a driving control circuit configured to control driving of the receiving coil;
wherein the temperature fuse is configured to become an open circuit when a temperature of the electronic circuit exceeds a temperature threshold; and
wherein the overheat protection circuit is configured to conduct a magnetic resonance signal received by the receiving coil after the temperature fuse becomes an open circuit, through a receiving circuit configured to process the magnetic resonance signal.

2. The magnetic resonance imaging apparatus according to claim 1, wherein the overheat protection circuit includes at least one of: (a) an inductor and (b) a parallel resonance circuit, serially connected to the temperature fuse.

3. A magnetic resonance imaging apparatus, said apparatus comprising:
- a transmitting coil configured to apply a radio-frequency magnetic field to a subject placed in a static magnetic field;
- a receiving coil configured to receive a magnetic resonance signal emitted from the subject in response to application of the radio-frequency magnetic field by the transmitting coil;
- an electronic circuit configured to be connected to the receiving coil; and
- an overheat protection circuit configured to include a temperature fuse arranged between the receiving coil and a driving control circuit configured to control driving of the receiving coil;
- wherein the temperature fuse is configured to become an open circuit when a temperature of the electronic circuit exceeds a temperature threshold; and
- wherein the electronic circuit comprises a balun including a resonance circuit configured to include a capacitor and an inductor.

4. The magnetic resonance imaging apparatus according to claim 1, wherein the electronic circuit comprises a balun including a resonance circuit configured to include a capacitor and an inductor.

5. The magnetic resonance imaging apparatus according to claim 2, wherein the electronic circuit comprises a balun including a resonance circuit configured to include a capacitor and an inductor.

6. The magnetic resonance imaging apparatus according to claim 3, wherein
- the inductor comprises a cable configured to include a shield having two ends and to be wound in a coil, and
- the capacitor is configured to connect both ends of the shield.

7. The magnetic resonance imaging apparatus according to claim 4, wherein
- the inductor comprises a cable configured to include a shield having two ends and to be wound in a coil, and
- the capacitor is configured to connect both ends of the shield.

8. The magnetic resonance imaging apparatus according to claim 5, wherein
- the inductor comprises a cable configured to include a shield having two ends and to be wound in a coil, and
- the capacitor is configured to connect both ends of the shield.

9. The magnetic resonance imaging apparatus according to claim 3, wherein
- the inductor is arranged outside a cable configured to include a shield that surrounds at least part of the cable, and a slit is formed on an external conductor of which both ends are connected to the shield, and
- the capacitor is connected to bridge the slit.

10. The magnetic resonance imaging apparatus according to claim 4, wherein
- the inductor is arranged outside a cable configured to include a shield that surrounds at least part of the cable, and a slit is formed on an external conductor of which both ends are connected to the shield, and
- the capacitor is connected to bridge the slit.

11. The magnetic resonance imaging apparatus according to claim 1, wherein the electronic circuit comprises at least one of: (a) a balun, (b) a trap circuit, (c) a cross diode, and (d) a choke coil.

12. The magnetic resonance imaging apparatus according to claim 11, wherein the overheat protection circuit includes at least one of: (a) an inductor and (b) a parallel resonance circuit, serially connected to the temperature fuse.

13. The magnetic resonance imaging apparatus according to claim 3, wherein the overheat protection circuit includes at least one of: (a) an inductor and (b) a parallel resonance circuit, serially connected to the temperature fuse.

14. The magnetic resonance imaging apparatus according to claim 13, wherein
- the inductor comprises a cable configured to include a shield having two ends and to be wound in a coil, and
- the capacitor is configured to connect both ends of the shield.

15. The magnetic resonance imaging apparatus according to claim 13, wherein
- the inductor is arranged outside a cable configured to include a shield that surrounds at least part of the cable, and a slit is formed on an external conductor of which both ends are connected to the shield, and
- the capacitor is connected to bridge the slit.

16. The magnetic resonance imaging apparatus according to claim 1, wherein
- the temperature fuse is arranged between the receiving coil and both the driving control circuit and a receiving circuit configured to process the magnetic resonance signal; and
- the overheat protection circuit is further configured to include:
- a first signal path for transmitting, through the temperature fuse, a drive signal for driving the receiving coil between the receiving coil and the driving control circuit, and the magnetic resonance signal between the receiving coil and the receiving circuit; and
- a second signal path for transmitting the magnetic resonance signal between the receiving coil and the receiving circuit.

17. The magnetic resonance imaging apparatus according to claim 3, wherein
- the temperature fuse is arranged between the receiving coil and both the driving control circuit and a receiving circuit configured to process the magnetic resonance signal; and
- the overheat protection circuit is further configured to include:
- a first signal path for transmitting, through the temperature fuse, a drive signal for driving the receiving coil between the receiving coil and the driving control circuit, and the magnetic resonance signal between the receiving coil and the receiving circuit; and
- a second signal path for transmitting the magnetic resonance signal between the receiving coil and the receiving circuit.

18. A receiving coil for receiving a magnetic resonance signal, comprising:
- an electronic circuit;
- an overheat protection circuit configured to include a temperature fuse arranged between the receiving coil and both a driving control circuit and a receiving circuit, wherein the driving control circuit is configured to control driving of the receiving coil and the receiving circuit is configured to process the magnetic resonance signal;
- a first signal path for transmitting, through the temperature fuse, a drive signal for driving the receiving coil between the receiving coil and the driving control circuit, and the magnetic resonance signal between the receiving coil and the receiving circuit; and a second signal path for transmitting the magnetic resonance signal between the receiving coil and the receiving circuit;

wherein the temperature fuse is configured to become an open circuit when a temperature of the electronic circuit exceeds a temperature threshold.

19. The receiving coil according to claim 18, wherein the overheat protection circuit is configured to conduct a magnetic resonance signal received by the receiving coil after the temperature fuse becomes open circuit, through the receiving circuit.

20. The receiving coil according to claim 18, wherein the electronic circuit comprises a balun including a resonance circuit configured to include a capacitor and an inductor.

* * * * *